United States Patent [19]

Brunst et al.

[11] Patent Number: 4,896,216

[45] Date of Patent: Jan. 23, 1990

[54] INTEGRATED CIRCUIT FOR READING OUT SIGNALS FROM AN OPTOELECTRONIC IMAGE SENSOR

[75] Inventors: Gerhard Brunst; Klaus Rohleder, both of Munich, Fed. Rep. of Germany

[73] Assignee: Siemens Aktiengesellschaft, Berlin and Munich, Fed. Rep. of Germany

[21] Appl. No.: 232,230

[22] Filed: Aug. 15, 1988

[30] Foreign Application Priority Data

Aug. 21, 1987 [DE] Fed. Rep. of Germany ....... 3727943

[51] Int. Cl.$^4$ .............................................. H04N 3/14
[52] U.S. Cl. ........................... 358/213.29; 358/213.11; 358/482
[58] Field of Search ...................... 358/213.29, 213.26, 358/293, 294, 212, 213.19, 482, 483

[56] References Cited

U.S. PATENT DOCUMENTS

| | | | |
|---|---|---|---|
| 4,426,664 | 1/1984 | Nagumo et al. | 358/213.26 |
| 4,575,638 | 3/1986 | Okumura | 358/213.29 |
| 4,597,012 | 6/1986 | Itoh et al. | 358/213.29 |
| 4,628,364 | 12/1986 | Koch | 358/213.19 |

FOREIGN PATENT DOCUMENTS 0075696 4/1983 European Pat. Off. ....... 358/213.29

OTHER PUBLICATIONS

Publication by IDEM, 1985, "a–Si:H TFT Array Driven Linear Image Sensor With Capacitance Coupling Isolation Structure", by H. Ito et al., pp. 436 to 439.

*Primary Examiner*—Jin F. Ng
*Assistant Examiner*—Stephen Brinich
*Attorney, Agent, or Firm*—Hill, Van Santen, Steadman & Simpson

[57] ABSTRACT

A linear opto-electronic image sensor has m groups of n sensor elements lying side-by-side on an integrated circuit, the sensor elements being connectable to inputs of a read-out circuit by switching transistors and data lines. M group associated data are being provided with n signal groups successively supplied to the m inputs of the read-out circuit. Every signal group is composed of m sensor signals that are simultaneously derived from the sensor elements having the same order and number within the individual groups.

13 Claims, 6 Drawing Sheets

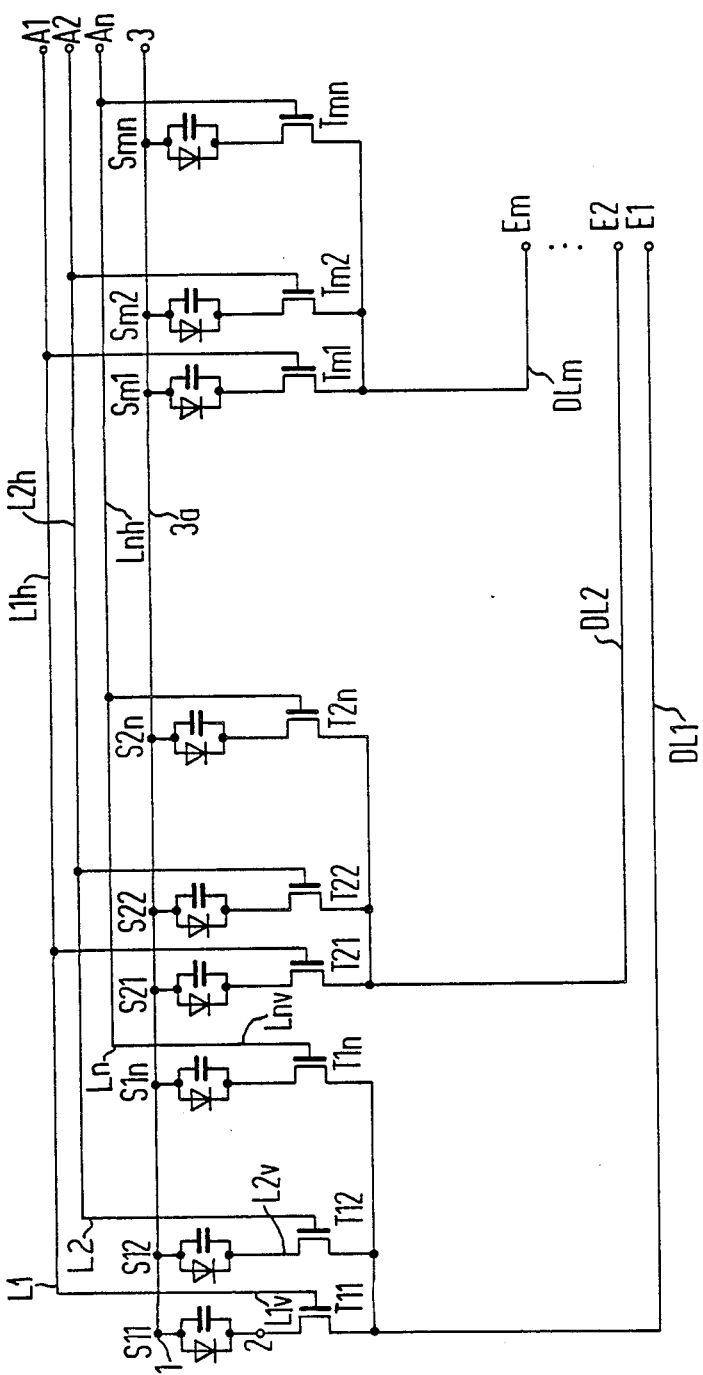

INTEGRATED CIRCUIT FOR READING OUT SIGNALS FROM AN OPTOELECTRONIC IMAGE SENSOR

BACKGROUND OF THE INVENTION

1. Field of the Invention

The present invention is directed generally to an integrated circuit for reading out sensor signals from an optoelectronic image sensor having groups of sensor elements arranged next to one another.

2. Description of the Related Art

In the publication IEDM, 1985, pages 436 through 439, and in particularly in FIGS. 1 and 2 therein, a circuit is disclosed for reading image sensor signals. Two groups of sensor elements each having 128 elements arranged linearly next to one another are provided. The 128 sensor elements of the first group are connected via switching transistors and data lines to an identical number of inputs of a read-out circuit, which is composed of a multiplexer. The 128 sensor elements of the second group are connected to the same multiplexer inputs via further switching transistors. The switching transistors are driven so that all sensor elements of the first group are connected through to the inputs of the multiplexer. Subsequently, all sensor elements of the second group are connected to the multiplexer inputs. The switching transistors are formed as thin-film transistors which are integrated with the sensor elements, the data lines, and the read out circuit on a common substrate. In the disclosed embodiment, a disadvantage is present in that a number of crossings of various data lines with one another occur which makes manufacture of the image sensor considerably more difficult. Furthermore, the data line crossings lead to the occurance of parasitic capacitances which greatly reduce the amplitudes of the read-out sensor signals, which in turn makes precise interpretation of the sensor signals considerably more difficult.

SUMMARY OF THE INVENTION

An object of the present invention is to provide an easily manufactured integrated circuit for reading out sensor signals of an image sensor, the number of crossings of the data lines of the integrated circuit being greatly reduced in comparison to the known arrangements. This and other objects are inventively achieved in an integrated circuit in which n sensor elements of each of m groups are connectable in individual succession to common group associated data lines via switching transistors and the switching transistors of different groups that have the same order number within a group are driven via common control lines.

An advantage obtained with the device of the present invention is that a high yield is achieved in the manufacture of the integrated circuit and that the parasitic capacitances between the data lines are greatly reduced so that higher sensor signals are supplied to the inputs of the read-out circuit than in the case of the known circuits. Moreover, disturbing mutual influences of the signals on the data lines and on the control lines are largely avoided with the integrated circuit of the present invention.

Advantageous developments and improvements of the invention include providing a shift register for selecting the control lines of switching transistors connected in series with second terminals of the sensor elements. In the integrated circuit, the image sensor is formed of a plurality of metallic electrodes that are arranged side-by-side on an insulating substrate and the end sections of the electrodes are covered by a strip of photoconductive material. The strip is occupied with a transparent electrode and the transparent electrode is wired to a constant voltage. In this embodiment, the switching transistors and the data lines are integrated on the insulating substrate together with the sensor elements.

In one embodiment, the data lines and control lines are separated from one another by a line of sensor elements and the control lines have line sections lying parallel to the line of sensor elements. It is advantageous to provide a shift register having outputs connected to control lines that are individually allocated to the sensor elements. In another embodiment, switching transistors are connected in series with the first terminals of the sensor elements between the sensor elements and a constant voltage source, and control lines are connected to the switching transistors to select the sensor elements of different groups having identical ordering numbers. A reset transistor may be provided to connect second terminals of the sensor elements to a terminal lying at a reference voltage, wherein the gate terminals of the reset transistors are applied to control lines for the switching transistor of neighboring ones of the sensor elements.

Additionally, a first memory may be included in the circuit of the present invention wherein read-out sensor signals are capable of being written into the first memory. The first memory is addressed through outputs of a group controller charged with a counting pulse sequence and with outputs of an element counter following upon the group counter. The sensor signals which have been written into the memory are read out by the counting pulse sequence supplied to the element counter and the group counter so that addressing of the memory occurs via counter outputs with transposed significance of the counters. It is a further development that the first memory be supplied with a second memory which is addressed in a corresponding fashion via a further group counter and further element counter and in that the sensor signals of a second read-out period are written into the second memory while the sensor signals stored in the first memory are being read out therefrom in a first read-out period.

The integrated circuit of the present invention finds particular usefulness as the optical sensor of a facsimile machine.

BRIEF DESCRIPTION OF THE DRAWINGS

FIG. 3 is a circuit diagram of a second exemplary embodiment of the invention in which the switching transistors are driven in a different way than in the circuit of FIG. 1;

DESCRIPTION OF THE PREFERRED EMBODIMENTS

Figure 1:
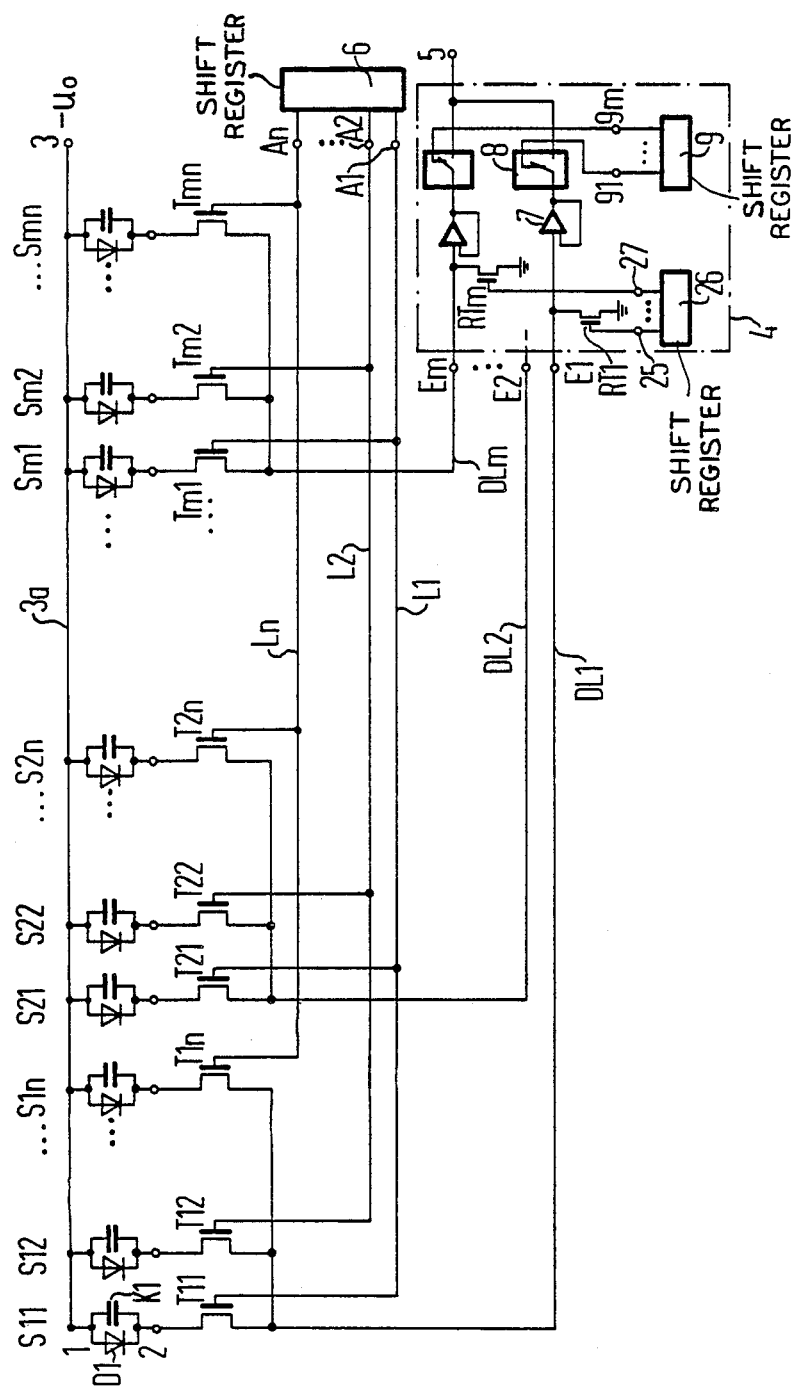
FIG. 1 is a circuit diagram of a first exemplary embodiment of the circuit of the present invention.
Figure 2:
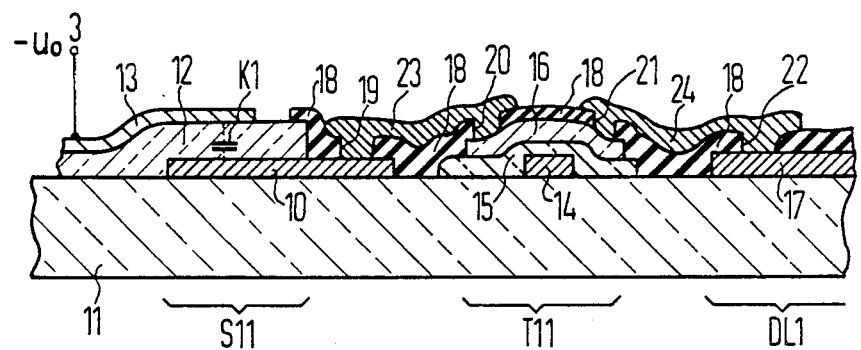
FIG. 2 is a cross section through an exemplary integrated circuit embodiment of the circuit of FIG. 1.

In FIG. 1, sensor elements S11 through Smn of a linear, opto-electronic image sensor are shown, the sensor elements S11 through Smn lying next to one another on an integrated circuit substrate 11 (shown in FIG. 2). The first image sensor S11 includes a photodiode D1 having first and second terminals 1 and 2 and a capacitor K1 representing the capacitance of the sensor element S11. The capacitor K1 is shown connected in parallel to the photodiode D1. For the sake of convenience, only the first sensor element S11 has the terminals 1 and 2 and the diode D1 and capacitor K1 labeled. Each of the remaining sensor elements S12 through Smn has an identical arrangement of parts. A constant voltage $-U_0$ is applied to the sensor element S11, and to the other sensor elements S12 through Smn through the terminals 1. The constant voltage $-U_0$ is applied at a terminal 3 shared by all of the sensor elements S11 through Smn via a lead 3a. The second terminal 2 of the sensor element S11 is connected to a first input E1 of a read-out circuit 4 through a source/drain path of a switching transistor T11 and through a data line DL1. In other words, the switching transistor T11 is connected in series with the second terminal 2 of the sensor element S11. A control line L1 drives the gate lead of the switching transistor T11, the control line L1 being connected to an output A1 of a shift register 6.

The remaining sensor elements S12 through Smn correspond in structure to the sensor element S11. Each of the sensor elements S12 through Smn have their first terminals 1 connected to the common terminal 3 and their second terminals 2 connected to either the data line DL1 or further data lines DL2 through DLm through allocated switching transistors T12 through Tmn, as will be set forth herein below. The further data lines DL2 through DLm are connected to respective further inputs E2 through Em of the read-out circuit 4. As will also be set forth in further detail, the gate leads of the switching transistors T12 through Tmn are wired to the control line L1 or to further control lines L2 through Ln, the further control lines L2 through Ln being applied to further outputs A2 through An of the shift register 6.

In further detail, the first n sensor elements S11 through S1n are combined to form a first group. The second terminals 2 of the first group of sensor elements S11 through S1n are connected through the switching transistors T11 through T1n to the data line DL1 which represents a group associated data line shared by all sensor elements of the first group. The next sensor elements S21 through S2n in the linear arrangement are combined to form a second group. The second terminals 2 of the second group are connected through the switching transistors T21 through T2n to a second group associated data line DL2. In analogous fashion, the following sensor elements are also combined in groups of n sensor elements and each group is connected to a corresponding group associated data line. The last group, which is composed of sensor elements Sm1 through Smn is wired to a last group associated data line DLm.

The control line L1 is connected to the gate terminals of the switching transistors T11, T21, . . . Tm1 which is associated with the first sensor elements S11, S21, . . . Sm1 in each of the m groups. The control line L2 is connected to the gates of the switching transistors T12, T22 through Tm2 associated with the sensor elements S12, S22 through Sm2 in each of the m groups. Finally, the control line Lm is connected to the gates of the switching transistors T1n, T2n through Tmn which are connected in series with the last, or nth, sensor element in each of the m groups. In general, all of the switching transistors of all m groups of the sensor elements S11 through Smn that have the same ordering, or sequence, number within the individual groups are selectable by each of the control lines L1 through Ln.

In detail, all of the switching transistors T11 through Tm1 are simultaneously activated in a first time span via the control line L1, so that the sensor signals output by the sensor elements S11, S21 through Sm1 are simultaneously applied to the inputs E1 through Em of the read-out circuit 4, in the form of a signal group. In other words, the control line L1 is used to supply the signals from the first sensor elements in each group to the read-out circuit 4. In a following, second time span, all of the switching transistors T12 through TM2 are activated by the second control line L2 so that a second signal group is applied to the inputs E1 through EM of the read-out circuit 4. The second signal group is composed of the sensor signals from the second sensor elements S12 through Sm2 of each group. In further time spans, corresponding signal groups from the sensor elements of respective ascending but identical ordering, or sequences number within the groups are received by the read-out circuit 4. The m sensor signals of the sensor elements S1n through Smn are applied to the inputs of the read-out circuit 4 in the nth time span by the switching transistors T1n through Tmn which have been made conductive by the control line Ln.

The switching transistors T11 through Tmn are driven so that a "1", or high output signal, is applied to their gates to turn-on the switching transistors, the turn-on signal being received from the first output A1 of the shift register 6 during the first time span. The remaining outputs A2 through An each have a "0", or low signal, during the first time span. In the second time span, a "1", or high signal, is output only on the second output A2. This sequence continues until a "1" is applied at the nth output An during the nth time span, at which time all of the other outputs of the shift register 6 are at a "0".

Still referring to FIG. 1, the read-out circuit 4 enclosed in broken outline-is formed so that all of the sensor signals of the signal group which are connected through the read-out circuit 4 to an output 5 are connected in individual succession within each and every one of the time spans. The sensor signal adjacent the input E1 is connected through to the output 5 first and the sensor signal adjacent the input Em is connected through to the output 5 last. Each input of the read-out circuit 4 is connected to a positive input of a differential amplifier, for example the input E1 is connected to the positive input of the differential amplifier 7. An output of each of the differential amplifiers provides negative feedback by being connected to the negative input of the corresponding differential amplifier and, secondly, the output of each differential amplifier is connected to the output 5 of the read-out circuit 4 through a sampling stage 8. For the sake of simplicity, only the first differential amplifier 7 and sampling stage 8 is labeled.

A shift register 9 is provided in the read-out circuit 4 to control the sampling stages 8. In particular, the shift register 9 has parallel outputs 91 through 9m connected to corresponding ones of the m sampling stages 8. Due to a "1" signal at the first shift register output 91, the first sampling stage 8 connects the output of the first differential amplifier 7 to the output 5 of the read-out circuit 4. At this time, all of the other sampling stages 8 are inhibited by "0" signals at the shift register outputs 92 (not shown) through 9m. Subsequently, the further outputs of the shift register 9 take on a "1" or high state in individual succession so that the sensor signals at the inputs E2 through Em subsequently proceed to the read-out circuit output 5 through the corresponding sampling stages 8. Sequential connection of the signals from the input side of the read-out circuit 4 to the output 5 is repeated in each of the following time spans.

The read-out circuit 4 of FIG. 1 also contains reset transistors RT1 through RTm each having a source-drain path connected to respective ones of the inputs E1 through Em of the read-out circuit 4. The reset transistors RT1 through RTm selectively connect the inputs E1 through Em to a reference potential for the read-out circuit 4. In the illustrated embodiment, the reference potential is ground. In FIG. 1, the reset transistor RT1 is at the input E1 and the last reset transistor RTm is at the corresponding last input Em. The gate of the first reset transistor RT1 is connected to a first output 25 of a shift register 26 and the gates of the further reset transistors through RTm, which are applied to the further inputs E2 through Em selected by the further outputs through a last output 27 of the shift register 26. The gate lead of the last reset transistor RTm thus is connected to the last output 27 of the shift register 26. Only one of the outputs, such as the output 25, is at a "1" and all of the other outputs are at a "0" at any particular time. As is known, clock signals are applied to the shift registers 6, 9 and 26 so that the output voltages are shift sequentially. For example, the "1" of the first output 25 of the shift register 26 is shifted step-by-step to the last output 27 by the supplied clock voltages. Of course, different clock frequencies are required for the above-described operation. It is within the purview of one of ordinary skill in the art to provide the appropriate clock signals for the shift registers as disclosed.

Referring now to FIG. 2, a cross section through a portion of an integrated circuit of the invention is shown, including the first sensor element S11 as well as the allocated switching transistor T11 and part of a connected data line DL1, all integrated on a substrate 11. The cross section of FIG. 2 is taken generally perpendicularly to the line of sensor elements S11 through Smn. The sensor element S11 includes a metallic electrode 10 of, for example, chrome which is vapor deposited on the insulating substrate 11 composed, for example, of glass. The metallic electrode 10 is covered with a layer 12 of amorphous silicon which is, in particular, composed of a-Si:H. A transparent electrode 13 which is, for example, an ITO electrode is positioned above the silicon layer 12. A capacitance which occurs between the metallic electrode 10 and the transparent electrode 13 is represented in FIG. 1 by K1. In one example, the silicon layer 12 and the transparent electrode 13 are formed strip-shaped and are allocated in common to all of the sensor elements S11 through Smn in the linear arrangement. As shown schematically, the electrode 13 is provided with a terminal 3 which, during operation, is connected to a constant voltage $-U_0$.

The first switching transistor T11 is advantageously formed as a thin-film transistor and, in detail, is composed of a gate electrode 14 vapor deposited onto the substrate 11. The gate electrode 14 is separated by a gate insulating layer 15 from an amorphous silicon layer 16 lying thereabove. The amorphous silicon layer 16 forms the source, drain and channel region of the switching transistor T11. An interconnect 17 is vapor-deposited onto the substrate 11 and represents the first data line DL1. The parts 12, 16 and 17 are covered with an intermediate insulating layer 18 which has through extending holes 19, 20, 21 and 22. A first conductive coating 23 is applied on the layer 18 and extends through the holes 19 and 20 to the contact respective parts 10 and 16. A second conductive coating 24 is applied to extend through the holes 21 and 22 to contact and connect the parts 16 and 17. The structure of the sensor element S11 shown corresponds roughly to a sensor set forth in the reference IEDM 1985, pages 436 through 439 and illustrated in FIG. 2 on page 437 thereof. All of the circuit parts shown in FIG. 1 of the present application are expediently integrated on the substrate 11 of FIG. 2.

The image sensor of FIGS. 1 and 2 operates as follows:

When the sensor element 11 is considered, then the capacitor K1 of the sensor element S11 is first charged to the voltage $-U_0$ as applied at the terminal 3 when the switching transistor T11 and the reset transistor RT1 are activated by the presence of a "1" signal at the outputs A1 and 25. The switching transistor 11 is inhibited at the conclusion of the charging phase for the capacitor K1. A discharge phase begins as the switching transisitor T11 is inhibited and the capacitor K1 partially discharges through the photodiode D1 during the discharge phase. The discharge of the capacitor K1 occurs by current flowing through the photodiode D1, the amplitude of the current being dependent on the intensity of the light impinging the sensor element S11. For a low intensity of incident light, the discharge current is low so that the charge of the capacitor K1 is diminished by only a small amount after the conclusion of the discharge phase. In one example, the discharge phase has a length of approximately 1 millisecond. The capacitor K1 discharges to a greater extent given higher intensity of incident light during a discharge phase of the same chronological duration.

At the end of the discharge phase, the switching transistor T11 is again activated and the reset transistor RT1 is inhibited. This permits the sensor signal at the second terminal 2 of the first sensor element S11 to be transmitted through the first data line DL1 to the first input E1 of the read-out circuit 4. When no incident light is sensed by the sensor element S11 there is no discharge whatsoever of the capacitor K1 and the sensor signal represents a zero signal. The sensor signal comes closer and closer to a signal value of $-U_0$ for an increase in the discharge of the capacitor K1 as more incident light is sensed. A sensor signal that is transmitted to the first input E1 is amplified in the first amplifier 7 and transmitted to the output 5 of the read-out circuit 4 through the sampling stage 8 as driven by the first output 91 of the shift register 9. After the transfer of the sensor signal from the second terminal 2 of the sensor element S11 by the activation of the sampling stage 8 and after the subsequent inhibit of the sampling stage 8, the reset transistor RT1 is also activated when the switching transistor T11 continues to be conductive, so that a new charging phase of the first sensor element S11 begins. This new charging phase is then terminated by a following inhibition of the switching transistor T11 which begins a further discharge phase. This further discharge phase is then ended by the next activation of the switching transistor T11 as well as inhibition of the reset transistor RT1, and a sensor signal which is formed in the sensor element S11 during this further discharge phase is read-out.

The switching transistor T11 is activated both during the read-out of the previously formed sensor signal as well as during the following charging phase and then remains inhibited during the formation of a new sensor signal. During the inhibit state of the switching transistor T11, which is during the discharge phase of the capacitor K1, all of the other switching transistors T12 through T1n that are situated in the same group with the sensor element S11 are activated in individual succession in order to enable the read-out of the sensor signals formed in the preceding discharge phases in the sensor elements S12 through S1n allocated to them as well as to enable the resetting of the sensor elements. This occurs during the respective activations of the switching transistors T12 through T1n. Taking into consideration the above-mentioned mutual chronological offset, the charging of the capacitors K1 of the sensor elements S11 through S1n, the subsequent formation of the sensor signals during the discharge phases, the read-out of the sensor signals, and the renewed charging of the capacitors for all of the sensor elements occurs in the same way by repeated, mutually chrononolgically offset of the switching of the switching transistors T11 through T1n, as well as the reset transistors RT1 through RTm from the inhibiting condition into the conductive condition and vis versa.

The above described sequence of the formation and readout of the individual sensor signals from the sensor elements S11 through S1n of the first group occurs simultaneously in analogous fashion in each of the other groups of sensor elements S21 through Smn as well. The sensor signals are read-out from the first sensors of all of the m groups so that the signals derived from the sensor elements S11, S21 through Sm1 form the first signal group. The sensor signals are subsequently read-out from the second sensor elements S12, S22 through Sm2 from all of the m groups to form the second signal group, etc.

A second exemplary embodiment of the invention is shown in FIG. 3 which differs from FIG. 1 only in that the switching transistors T11 through Tmn are driven somewhat differently. The read-out circuit 4 is present although it is not shown for the sake of simplicity. Similarly, the read-out circuit 4 is not shown in the following figures. The control lines L1 through Ln and the data lines DL1 through DLm are separated from one another on the integrated circuit by the row of sensor elements S11 through Smn. Portions of these lines proceed parallel to the row of sensor elements S11 through Smn and are connected to the inputs E1 through EM of the read-out circuit 4 (shown in FIG. 1) or to the outputs A1 through An of the shift register 6 (shown in FIG. 1). As may be seen in detail in FIG. 3, the control lines L1 through Ln each have short vertical line segments L1v, L2v through Lnv extending perpendicular on the integrated circuit to the row of sensor elements S11 through Smn. The vertical line sections L1v through Lnv are dimensioned long enough so that the upper ends as shown in FIG. 3 extend above the lead 3a which connects the common terminal 3 to the first terminals 1 of the individual sensor elements S11 through Smn. The vertical line sections L1v through Lnv each cross the lead 3a and are separated therefrom by an insulating layer (not shown). When the circuit of FIG. 3 is formed on the basis of the embodiment of the sensor elements shown in FIG. 2, then the lead 3a of the circuit shown in FIG. 3 is composed of the strip-shaped electrode 13. Horizontally extending control line sections, for example L1h through Lnh, lie substantially parallel to the line of sensor elements S11 through Smn and extend from the upper ends of the vertical line sections, for example L1v through Lnv, and to the outputs A1 through An of the shift register 6. This avoids the crossing of the control lines L1 through Ln with the data lines DL1 through DLm which occurs in the embodiment of FIG. 1.

Figure 4:
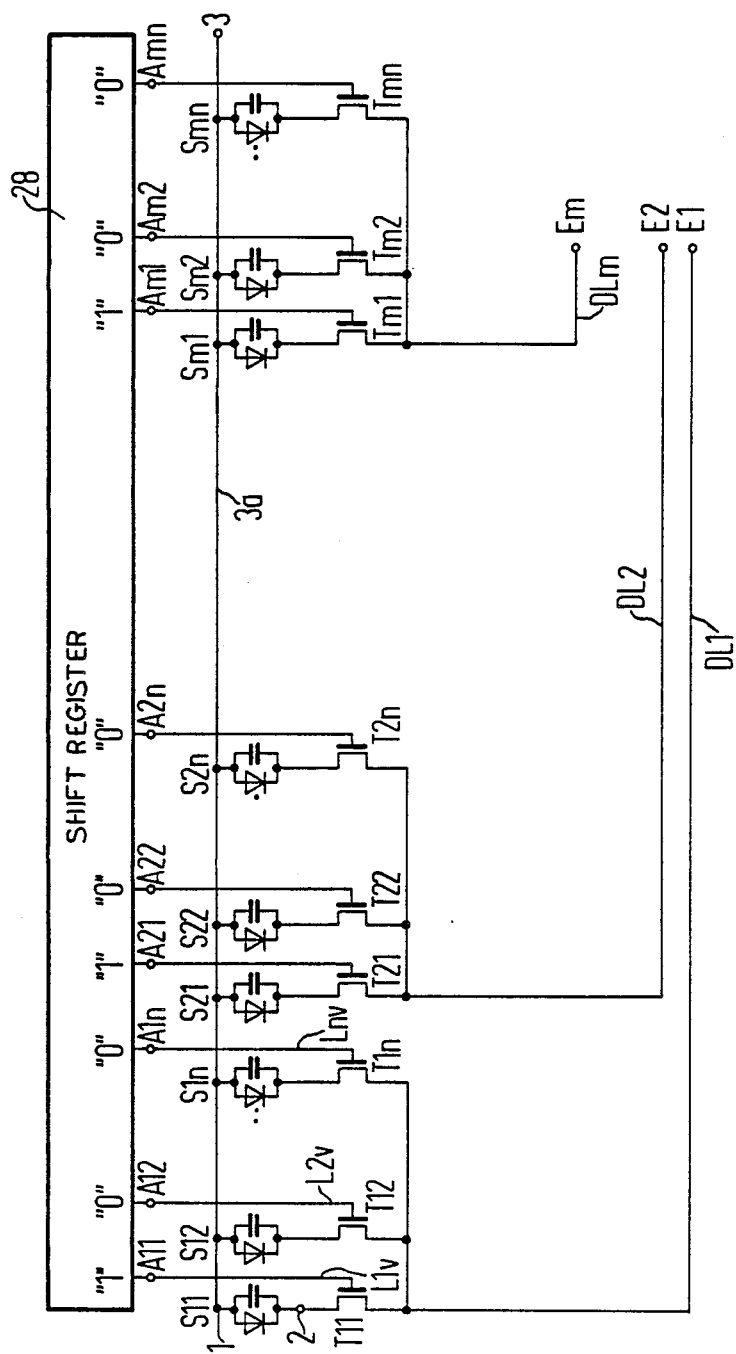
FIG. 4 is a circuit diagram of a third exemplary embodiment of the invention wherein the switching transistors are again driven in a different way than in the previous circuits.

A further embodiment shown in FIG. 4 differs from the embodiment of FIG. 3 in that the shift register 6 of FIG. 1 is replaced by a shift register 28 that has a plurality of parallel outputs A11 through Amn corresponding in number to the plurality of sensor elements S11 through Smn. The shift register 28 extends along the row of sensor elements S11 through Smn on the integrated circuit and the parallel outputs A11 through Amn are arranged next to the corresponding ones of the sensor elements S11 through Smn in FIG. 4. It is, therefore, possible to directly connect the vertical line sections, for example L1v through Lnv, of the control lines for the switching transistors T11 through Tmn to the outputs A11 through Amn of the shift register 28.

The illustrated device operates by applying an output signal of "1" to the outputs A11, A21 through Am1 so that the first sensor elements S11, S21 through Sm1 of all m groups are selected. All other outputs of the shift register 28 are at a "0" signal. The output signal pattern of the shift register 28 is shifted step-by-step to the right until it has been shifted by n locations so that the sensor signals of all n sensor elements of each group are read out. It is, thus, possible to drive the switching transistors T11 through Tmn without having the control lines therefor cross outside of the shift register 28. Moreover, the number of crossings of the control lines inside the shift register 28 increases only proportionally to the number of the sensor elements S11 through Smn in the line. Furthermore, the control lines L1v through Lnv, for example, are significantly shorter than those of the embodiments shown in FIGS. 1 or 3. It is especially advantageous to integrate the shift register 28 on the same substrate 11 as the sensor elements S11 through Smn, the data lines DL1 through DLm, and the control lines L1v through Lnv, for example.

Figure 5:
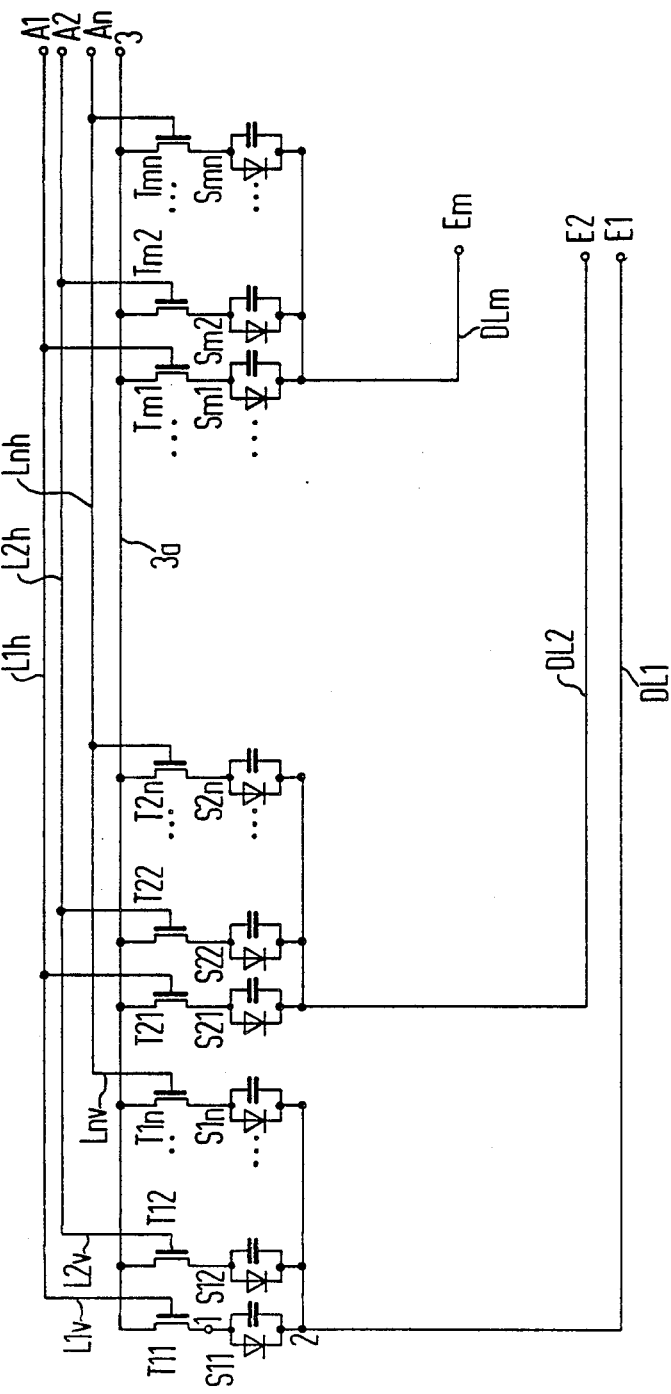
FIG. 5 is a circuit diagram of a fourth exemplary embodiment of the invention wherein the switching transistors are arranged in yet a different way.

In FIG. 5, a further exemplary embodiment is shown which differs from the embodiment of FIG. 3 in that the switching transistors T11 through Tmn are connected between the first terminals 1 of the sensor elements S11 through Smn and the lead 3a of.the common terminal 3, instead of being connected between the terminal 2 of the sensor element and the appertaining data line. As a result, the vertical line sections, for example L1v, L2v through Lnv, of the control lines for the switching transistors T11 through Tmn are shorter and are not conducted between neighboring sensor elements, as is the case in the circuit arrangement of FIG. 3. The switching transistors T11 through Tmn are driven in the same way already set forth with reference to FIG. 1.

Thus, the embodiment of FIG. 5 has the horizontal control line sections L1h through Lnh substantially parallel to the line of sensor elements, as in FIG. 3, but permits the sensor elements to lie closer together since the vertical sections of the control leads are now above the sensor elements.

Figure 6:
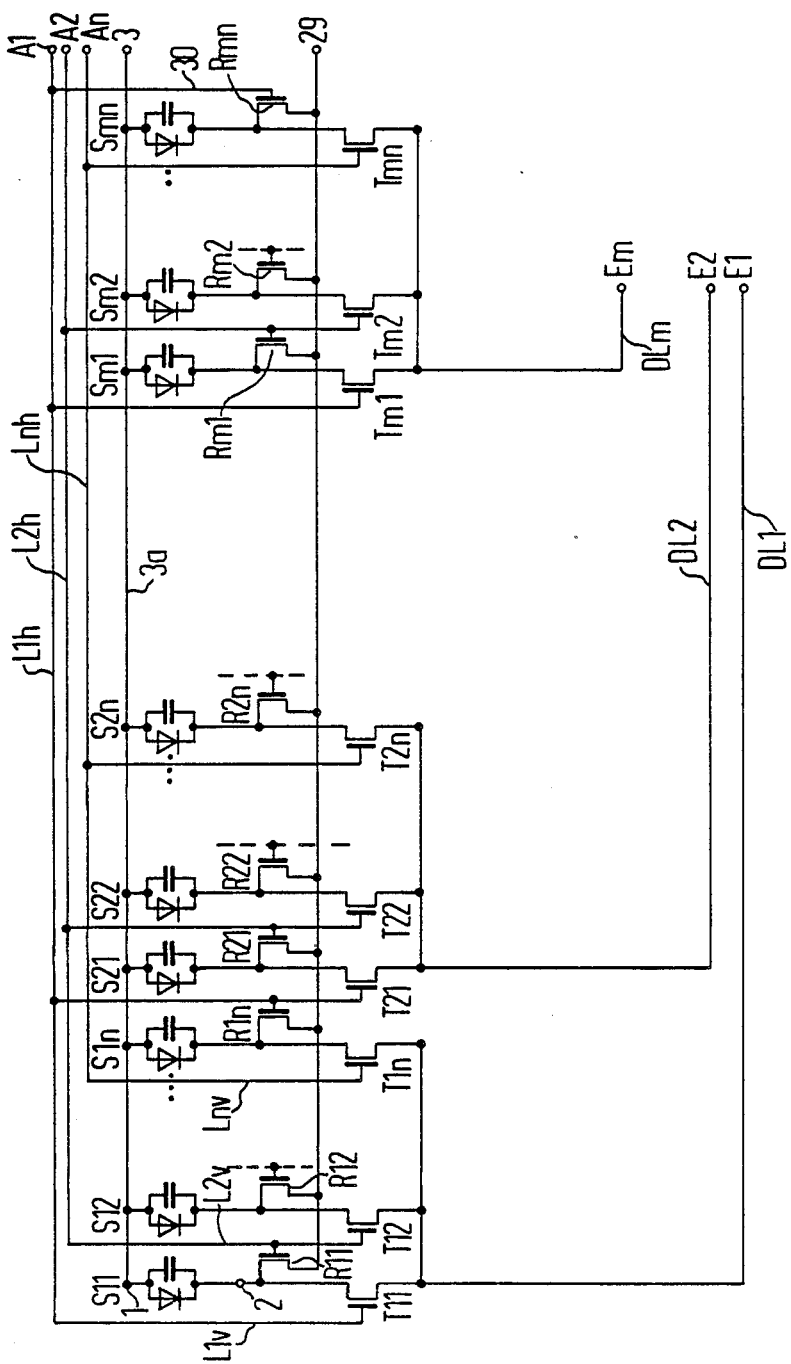
FIG. 6 is a circuit diagram of a fifth exemplary embodiment for providing a faster read-out of the image sensor.

With reference now to FIG. 6, an embodiment of the invention is shown which represents a development of the circuit of FIG. 3. In terms of their arrangement on the substrate, the sensor elements S11 through Smn, the switching transistors T11 through Tmn, the data lines DL1 through DLm, and the control lines L1v and L1h through Lnv and Lnh correspond to those shown in FIG. 3 except that the vertical sections L1v through Lnv of the control lines are conducted past the respective sensor elements S11 through S1n, for example, at the left side of the corresponding sensor elements. Just as in the embodiment of FIG. 3, the upper ends of the vertical line sections L1v through Lnv, for example, are connected to the outputs A1 through An of a shift register 6 via the horizontal line sections L1h through Lnh. In addition, the second terminal 2 of every sensor element S11 through Smn is connected to a terminal 29 lying at a reference potential via a reset transistor R11 through Rmn. The gates of the reset transistors R11 through Rm(n−1) are each connected to the vertical line sections of the control lines for the switching transistors T12 through Tmn of the following sensor elements. Only the last reset transistor Rmn of the last sensor element Smn is wired directly to the output A1 of the shift register 6 by an additional line 30.

In the circuit arrangement of FIG. 3, the read-out phase and the charging phase which follows thereupon had to elapse for a sensor element before the switching transistor could be inhibited and before the next sensor element could be read-out by activating the appertaining switching transistor. In the embodiment of FIG. 6, however, as a consequence of the separate drive of each and every sensor element for the purposes of read-out and resetting, the read-out phase of the next successive sensor element, for example, S12, can begin immediately after the end of the read-out phase for the preceding sensor element, for example, S11, and following the inhibit state of the switching transistor, for example, T11, allocated thereto. This occurs by activating the switching transistor, for example, T12, allocated to the next-successive sensor element S12. The preceding sensor element, for example S11, is again charged to a voltage of $-U_0$ simultaneously therewith by the transmissive state of the reset transistor, for example, R11. Each succeeding sensor element is read out the same way. The charging events and the read-out events, thus, overlap for the sensor elements so that a faster read-out of the image sensor of FIG. 6 occurs in comparison to the circuit of FIG. 3.

Figure 7:
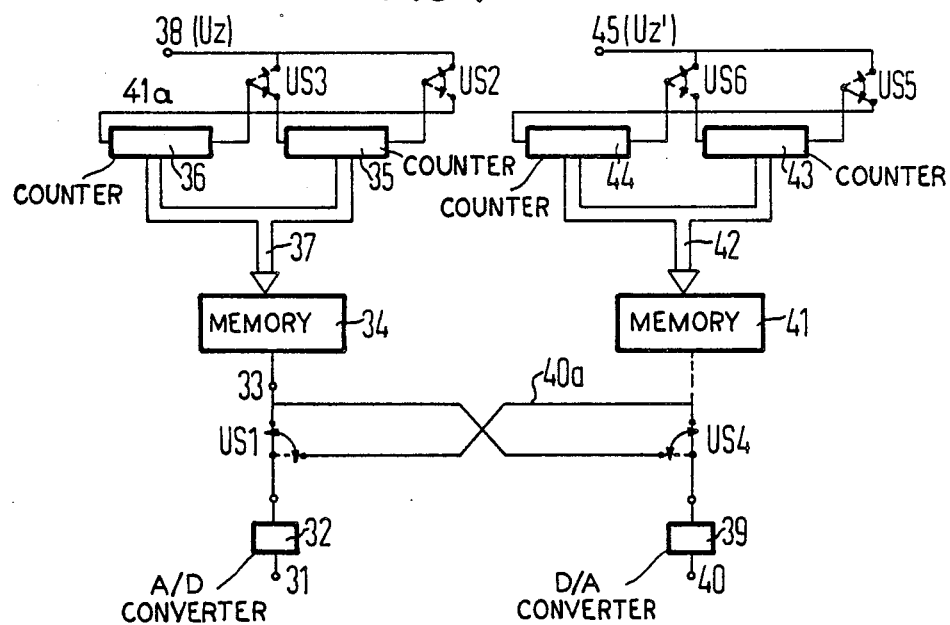
FIG. 7 is a block circuit diagram of an auxiliary circuit for connection following the read-out circuits of FIGS. 1 and 3 throughy 6.

FIG. 7 shows a circuit which resorts the sensor signals sequentially read-out in the described way in such a manner that they can be read-out in the sequence of the arrangement of the sensor elements S11 through Smn generating them. To this end, an input 31 of the circuit of FIG. 7, which is connected to the output 5 of the read-out circuit 4 of FIG. 1, is connected to a data input 33 of a digital memory 34 via an analog-to-digital converter 32 and via a switch-over means US1 when the switch is in the illustrated switch position. The sensor signals present at the output 5 (as shown in FIG. 1) are supplied to the input 31, are digitized in the converter 32 and are read into the addressed memory locations of the memory 34.

Two counters 35 and 36 having outputs connected to the address input of the memory 34 through lines 37 serve to generate the memory addresses. A counting input of the counter 35, also referred to as the group counter, is charged with a counting pulse sequence Uz supplied through a terminal 38. Every counting pulse of the pulse sequence Uz increments the counter 35 by one. As soon as the group counter 35 has reached the counter reading m, the counter 35 sends a counting pulse through a switch-over means US3, which is in the illustrated switch position, to a counting input of the counter 36 (referred to as an element counter). The pulse transmitted to the element counter 36 by the group counter 35 increments the element counter 36 by one. The next m counting pulses of the pulse sequence Uz again increments the group counter 35 from 0 to m, after which a counting pulse is again forwarded to the element counter 36 once the count m is reached.

When the successive sensor signals are read in into the memory 34, the group counter 35 represents a low order counter and the element counter 36 represents a high order counter. Memory locations in the memory 34 are addressed via the address lines 37 so that the counter reading of the counter 35 forms the least significant places of the address signal and the counter reading of the counter 36 forms the more significant places of the address signal.

Read-out of the stored sensor signals occurs through a further switch-over means US4 when moved in the switch position shown in broken lines in FIG. 7 so that a data input/output 33 is connected to an output 40 of a digital-to-analog converter 39. It is adequate to bring the switch-over means US2 and US3 into the switch positions shown in broken lines in FIG. 7 to achieve the desired re-sorting of the sensor signals. In these switch positions, the counter 36 has the lower significance and is incremented by one of the counting pulses in the pulse sequence supplied at the lead 38. When the counter reading n is reached, the counter 36 forwards a counting pulse through a line 41a and the switch-over means US2 to the counting input of the counter 35 is incremented by one. Addressing of the memory locations upon read-out occurs with an interchanged significance of the address parts generated by the counters 35 and 36. What is achieved is that the sensor signals of the sensor elements S11 through Smn are read out at the output 40 in the sequence of the arrangement of the sensor signals S11 through Smn on the image sensor.

The circuit of FIG. 7 can be supplemented by a second memory 41 which is addressed in a corresponding fashion via lines 42 connected to outputs of a group counter 43 and an element counter 44. The counters 43 and 44 are supplied with a counting pulse sequence Uz' via a terminal 45 and switch-over means US5 and US6, each moved to their switch positions shown in broken lines. By supplying the counting pulse sequence Uz' to this circuit, the sensor signals generated by the sensors S11 through Smn are read into the second memory 41 during a second read-out period via the switch-over means US1 which is also in the position shown in broken lines and via a line 40a in the same fashion as already set forth with reference to the first memory 34 for the signals of the first read-out period. Since all the switch-over means US1 through US6 are in the switch positions shown in broken lines, the sensor signals of the first read-out period are read-out from the first memory 34 and the sensor signals of the second read-out period ar simultaneously written into the second memory 41. After the conclusion of the write-in event, the switchover means US1 through US6 are moved to the switch positions shown in solid lines and the sensor signals of the second read-out period stored in the second memory 41 are transmitted from the second memory 41 to the output 40 whereas the sensor signals of a third read-out period are supplied to the input 31 and are simultaneously written into the first memory 34. The frequencies of the counting pulses Uz and Uz' may coincide although this is not absolutely necessary.

Since the image sensor continuously supplies sensor signals, the circuit of FIG. 7, which has the first and second memories 34 and 41, is in a position to read sensor signals of a read-out period from one of the memories in the proper sequence while the sensor signals of the next successive readout period are being read into the other memory.

An advantageous application of an opto-electronic image sensor of the invention provides that the length dimension of the line of sensor elements S11 through Smn which are integrated on the substrate 11 corresponds to one dimension of a document to be scanned. The document is moved past the image sensor in the direction of its other dimension. Only a simple, non-demagnifying optical arrangement need be arranged between the document surface to be scanned and the image sensor. The overall structure of an image sensor utilized in this way may be used within the framework of a facsimile apparatus which is derived from the publication Toshiba Review, No. 149, Fall 1984, pages 33–36.

Although other modifications and changes may be suggested by those skilled in the art, it is the intention of the inventors to embody within the patent warranted hereon all changes and modifications as reasonably and properly come within the scope of their contribution to the art.

We claim:

1. An integrated circuit for reading out signals of a linear opto-electronic image sensor, comprising:
    m groups of n sensor elements positioned next to one another in a line, ones of said sensor elements in said groups corresponding to ordering numbers in respective ones of said groups, each of said sensor elements having first and second terminals, said first terminals being connectable to a substantially constant voltage;
    switching transistors connected in series with said second terminals of said sensor elements for connecting n sensor elements of every group in individual succession to common group-associated data lines;
    common control lines connected to drive said switching transistors connected to said sensor elements of identical ordering numbers in different ones of said groups; and
    a read-out circuit having inputs connected via m ones of said common group associated data lines and said switching transistors to said second terminals of said sensor elements, said inputs of said read-out circuit being supplied simultaneously with a signal group of m sensor signals of all of said sensor elements having the same ordering numbers, said inputs of said read-out circuit being supplied with corresponding signal groups of different ordering numbers in n successive time segments.

2. An integrated circuit as claimed in claim 1, further comprising:
    a shift register having outputs connected to select said control lines.

3. An integrated circuit as claimed in claim 1, wherein said image sensor includes:
    an insulating substrate;
    a plurality of metallic electrodes arranged side-by-side on said insulating substrate;
    a strip of photoconductive material covering end sections of said metallic electrodes;
    a transparent electrode provided on said strip and said transparent electrode being connectable to a constant voltage.

4. An integrated circuit as claimed in claim 3, wherein said switching transistors and said data lines are integrated on said insulating substrate together with said sensor elements.

5. An integrated circuit as claimed in claim 1, wherein said sensor elements are arranged in a line and said data lines and said control lines are separated from one another by said line of said sensor elements, said control lines having line sections proceeding substantially parallel to said line of sensor elements.

6. An integrated circuit as claimed in claim 1, wherein a shift register has outputs connected to said control lines, each of said shift register outputs being individually allocated to ones of said sensor elements.

7. An integrated circuit as claimed in claim 1, further comprising:
    reset transistor said second terminals of said sensor elements to a terminal lying at a reference potential, gate terminals of said reset transistors being connected to ones of said control lines allocated to said switching transistors of neighboring ones of said sensor elements.

8. An integrated circuit as claimed in claim 1, further comprising:
    a circuit including a first memory into which read-out signals of said sensor elements are capable of being written;
    a group counter having outputs connected to address said first memory, said group counter being connected to receive a counting pulse sequence;
    an element counter having outputs connected to address said first memory; and
    said element counter following upon said group counter, said circuit being connected so that sensor signals of said sensor elements that have been written in to said first memory are read-out as said counting pulse sequence is supplied to said element counter and said group counter so that addressing of the first memory ensues with transposed significance of the counters.

9. An integrated circuit as claimed in claim 8, further comprising:
    a second memory;
    a second group counter and a second element counter connected to address said second memory, said second memory being connected for writing in sensor signals of a second read-out period while sensor signals stored in said first memory are read-out from said first memory in a first read-out period.

10. An integrated circuit for reading out signals of an opto-electronic image sensor, comprising:
    m groups of n sensor elements positioned side-by-side, each of said sensor elements having first and second terminals, ones of said sensor elements in said groups corresponding to ordering numbers in respective ones of said groups;

switching transistors connected in series with said first terminals of said sensor elements for connecting n of said sensors of every group in individual succession to a substantially constant voltage;

common group-associated data lines being connected to said second terminals of said sensor elements;

common control lines connected to select said switching transistors of said sensor elements of different groups having identical ordering numbers in different ones of said groups; and a read-out circuit having m inputs connected to m of said group associated data lines, said inputs being simultaneously supplied with a signal group of m sensor signals of all of said sensor elements having the same ordering numbers and being supplied with corresponding signal groups of differing ordering numbers in n successive time segments.

11. An integrated circuit as claimed in claim 10, further comprising:

reset transistors connecting said second terminals of said sensor elements to a terminal lying at a reference potential, gate terminals of said reset transistors being connected to ones of said control lines allocated to said switching transistors of neighboring ones of said sensor elements.

12. An integrated circuit as claimed in claim 10, further comprising:

a circuit including a first memory into which read-out signals of said sensor elements are capable of being written;

a group counter having outputs connected to address said first memory, said group counter being connected to receive a counting pulse sequence;

an element counter having outputs connected to address said first memory; and said element counter following upon said group counter, said circuit being connected so that sensor signals of said sensor elements that have been written in to said first memory are read-out as said counting pulse sequence is supplied to said element counter and said group counter so that addressing of the first memory ensues with transposed significance of the counters.

13. An integrated circuit as claimed in claim 12, further comprising:

a second memory;

a second group counter and a second element counter connected to address said second memory, said second memory being connected for writing in sensor signals of a second read-out period while sensor signals stored in said first memory are read-out from said first memory in a first read-out period.

* * * * *